(12) United States Patent
Hasebe et al.

(10) Patent No.: US 8,168,270 B2
(45) Date of Patent: *May 1, 2012

(54) FILM FORMATION METHOD AND APPARATUS FOR SEMICONDUCTOR PROCESS

(75) Inventors: Kazuhide Hasebe, Nirasaki (JP); Yoshihiro Ishida, Nirasaki (JP); Takehiko Fujita, Nirasaki (JP); Jun Ogawa, Nirasaki (JP); Shigeru Nakajima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1223 days.

This patent is subject to a terminal disclaimer.

(21) Appl. No.: 11/896,752

(22) Filed: Sep. 5, 2007

(65) Prior Publication Data
US 2008/0107824 A1 May 8, 2008

(30) Foreign Application Priority Data
Sep. 6, 2006 (JP) ................................. 2006-242043

(51) Int. Cl.
*C23C 16/513* (2006.01)
(52) U.S. Cl. ........................ 427/579; 427/569; 427/578
(58) Field of Classification Search .................... None
See application file for complete search history.

(56) References Cited

U.S. PATENT DOCUMENTS
7,396,719 B2   7/2008   Kim et al.
7,651,730 B2   1/2010   Hasebe
2006/0032443 A1*   2/2006   Hasebe et al. ............... 118/715
2007/0010071 A1*   1/2007   Matsuura ...................... 438/478
2007/0137572 A1   6/2007   Matsuura et al.
2008/0268653 A1   10/2008   Kim et al.

FOREIGN PATENT DOCUMENTS
JP   2004-281853   10/2004
JP   2004-343017   12/2004
JP   2006-054432   2/2006
KR   10-2005-0005726   1/2005
KR   10-2006-0007375   1/2006
KR   10-2006-0050163   5/2006

OTHER PUBLICATIONS

Yokoyama, Applied Surface Science, v130-132, 1998, p. 352-6.*
Mui, Surface Science, V557, 2004, p. 159-170.*
Hall, Journal of Physical Chemisty B, 2001, 105, 12068-75.*
Korean Office Action issued on Jun. 24, 2011 for Application No. 10-2007-0089845 with English translation.

* cited by examiner

*Primary Examiner* — Timothy Meeks
*Assistant Examiner* — Joseph Miller, Jr.
(74) *Attorney, Agent, or Firm* — Smith, Gambrell & Russell, LLP

(57) ABSTRACT

An oxide film is formed on a target substrate by CVD, in a process field to be selectively supplied with a first process gas including a source gas containing a film source element and no amino group, a second process gas including an oxidizing gas, and a third process gas including a preliminary treatment gas. A first step includes an excitation period of supplying the third process gas excited by an exciting mechanism, thereby performing a preliminary treatment on the target substrate by preliminary treatment gas radicals. A second step performs supply of the first process gas, thereby adsorbing the film source element on the target substrate. A third step includes an excitation period of supplying the second process gas excited by an exciting mechanism, thereby oxidizing the film source element adsorbed on the target substrate by oxidizing gas radicals.

20 Claims, 5 Drawing Sheets

FILM FORMATION METHOD AND APPARATUS FOR SEMICONDUCTOR PROCESS

BACKGROUND OF THE INVENTION

1. Field of the Invention

The present invention relates to a film formation method and apparatus for a semiconductor process for forming an oxide film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. For example, where a silicon oxide film is formed on semiconductor wafers, tetraethoxysilane (TEOS: $Si(OC_2H_5)_4$) may be used to perform a CVD (Chemical Vapor Deposition) process as a film formation process in a vertical heat processing apparatus (of the so-called batch type).

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD process which performs film formation while intermittently supplying a source gas and so forth to repeatedly form layers each having an atomic or molecular level thickness, one by one, or several by several. In general, this film formation method is called ALD (Atomic Layer Deposition) or MLD (Molecular Layer Deposition), which allows a predetermined process to be performed without exposing wafers to a very high temperature. Further, the ALD or MLD film formation provides good step coverage, and thus is suitable for filling recess portions of semiconductor devices, such as inter-gate gaps, which have become narrower with increased miniaturization of the devices. For example, Jpn. Pat. Appln. KOKAI Publication No. 2004-281853 (Patent Document 1) discloses a method of forming a silicon nitride film by ALD at a low temperature of 300 to 600° C.

On the other hand, where oxide films, such as a silicon oxide film, are thinner along with increased miniaturization of the devices, they may cause various problems depending on the quality. For example, where a gate oxide film is thinner, a leakage current may be increased if the film quality is not good.

BRIEF SUMMARY OF THE INVENTION

An object of the present invention is to provide a film formation method and apparatus for a semiconductor process, which can form an oxide film of high quality at a low temperature.

According to a first aspect of the present invention, there is provided a film formation method for a semiconductor process for forming an oxide film on a target substrate by CVD, in a process field configured to be selectively supplied with a first process gas comprising a source gas containing a film source element and no amino group, a second process gas comprising an oxidizing gas, and a third process gas comprising a preliminary treatment gas, the method being arranged to perform a plurality of cycles to laminate thin films respectively formed by the cycles, thereby forming the oxide film with a predetermined thickness, each of the cycles alternately comprising, in an order set forth below: a first step of performing supply of the third process gas to the process field while stopping supply of the first and second process gases to the process field, the first step comprising an excitation period of supplying the third process gas to the process field while exciting the third process gas by an exciting mechanism, thereby performing a preliminary treatment on a surface of the target substrate by use of radicals of the preliminary treatment gas thus generated; a second step of performing supply of the first process gas to the process field while stopping supply of the second and third process gases to the process field, thereby adsorbing the film source element on the surface of the target substrate; and a third step of performing supply of the second process gas to the process field while stopping supply of the first and third process gases to the process field, the third step comprising an excitation period of supplying the second process gas to the process field while exciting the second process gas by an exciting mechanism, thereby oxidizing the film source element adsorbed on the surface of the target substrate by use of radicals of the oxidizing gas thus generated.

According to a second aspect of the present invention, there is provided a film formation apparatus for a semiconductor process, comprising: a process container having a process field configured to accommodate a target substrate; a support member configured to support the target substrate inside the process field; a heater configured to heat the target substrate inside the process field; an exhaust system configured to exhaust gas from inside the process field; a first process gas supply circuit configured to supply a first process gas comprising a source gas containing a film source element and no amino group to the process field; a second process gas supply circuit configured to supply a second process gas comprising an oxidizing gas to the process field; a third process gas supply circuit configured to supply a third process gas comprising a preliminary treatment gas to the process field; an exciting mechanism configured to selectively excite the second and third process gases to be supplied to the process field; and a control section configured to control an operation of the apparatus, wherein, in order to form an oxide film on the target substrate by CVD, the control section performs a plurality of cycles to laminate thin films respectively formed by the cycles, thereby forming the oxide film with a predetermined thickness, each of the cycles alternately comprising, in an order set forth below: a first step of performing supply of the third process gas to the process field while stopping supply of the first and second process gases to the process field, the first step comprising an excitation period of supplying the third process gas to the process field while exciting the third process gas by an exciting mechanism, thereby performing a preliminary treatment on a surface of the target substrate by use of radicals of the preliminary treatment gas thus generated; a second step of performing supply of the first process gas to the process field while stopping supply of the second and third process gases to the process field, thereby adsorbing the film source element on the surface of the target substrate;

and a third step of performing supply of the second process gas to the process field while stopping supply of the first and third process gases to the process field, the third step comprising an excitation period of supplying the second process gas to the process field while exciting the second process gas by an exciting mechanism, thereby oxidizing the film source element adsorbed on the surface of the target substrate by use of radicals of the oxidizing gas thus generated.

According to a third aspect of the present invention, there is provided a computer readable medium containing program instructions for execution on a processor, which is used for a film formation apparatus for a semiconductor process for forming an oxide film on a target substrate by CVD, in a process field configured to be selectively supplied with a first process gas comprising a source gas containing a film source element and no amino group, a second process gas comprising an oxidizing gas, and a third process gas comprising a preliminary treatment gas, wherein the program instructions, when executed by the processor, control the film formation apparatus to performs a plurality of cycles to laminate thin films respectively formed by the cycles, thereby forming the oxide film with a predetermined thickness, each of the cycles alternately comprising, in an order set forth below: a first step of performing supply of the third process gas to the process field while stopping supply of the first and second process gases to the process field, the first step comprising an excitation period of supplying the third process gas to the process field while exciting the third process gas by an exciting mechanism, thereby performing a preliminary treatment on a surface of the target substrate by use of radicals of the preliminary treatment gas thus generated; a second step of performing supply of the first process gas to the process field while stopping supply of the second and third process gases to the process field, thereby adsorbing the film source element on the surface of the target substrate; and a third step of performing supply of the second process gas to the process field while stopping supply of the first and third process gases to the process field, the third step comprising an excitation period of supplying the second process gas to the process field while exciting the second process gas by an exciting mechanism, thereby oxidizing the film source element adsorbed on the surface of the target substrate by use of radicals of the oxidizing gas thus generated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
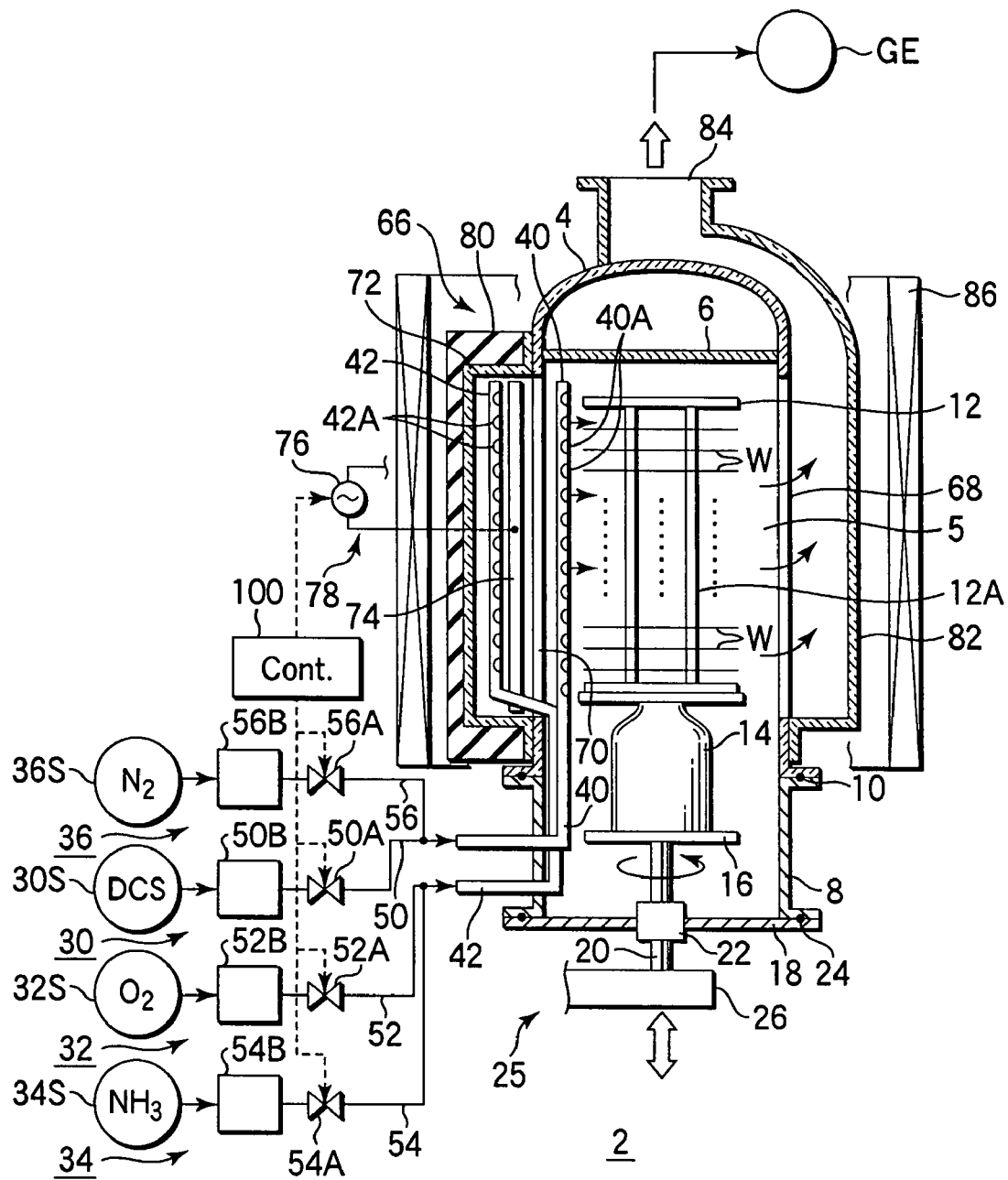
FIG. 1 is a sectional view showing a film formation apparatus (vertical CVD apparatus) according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
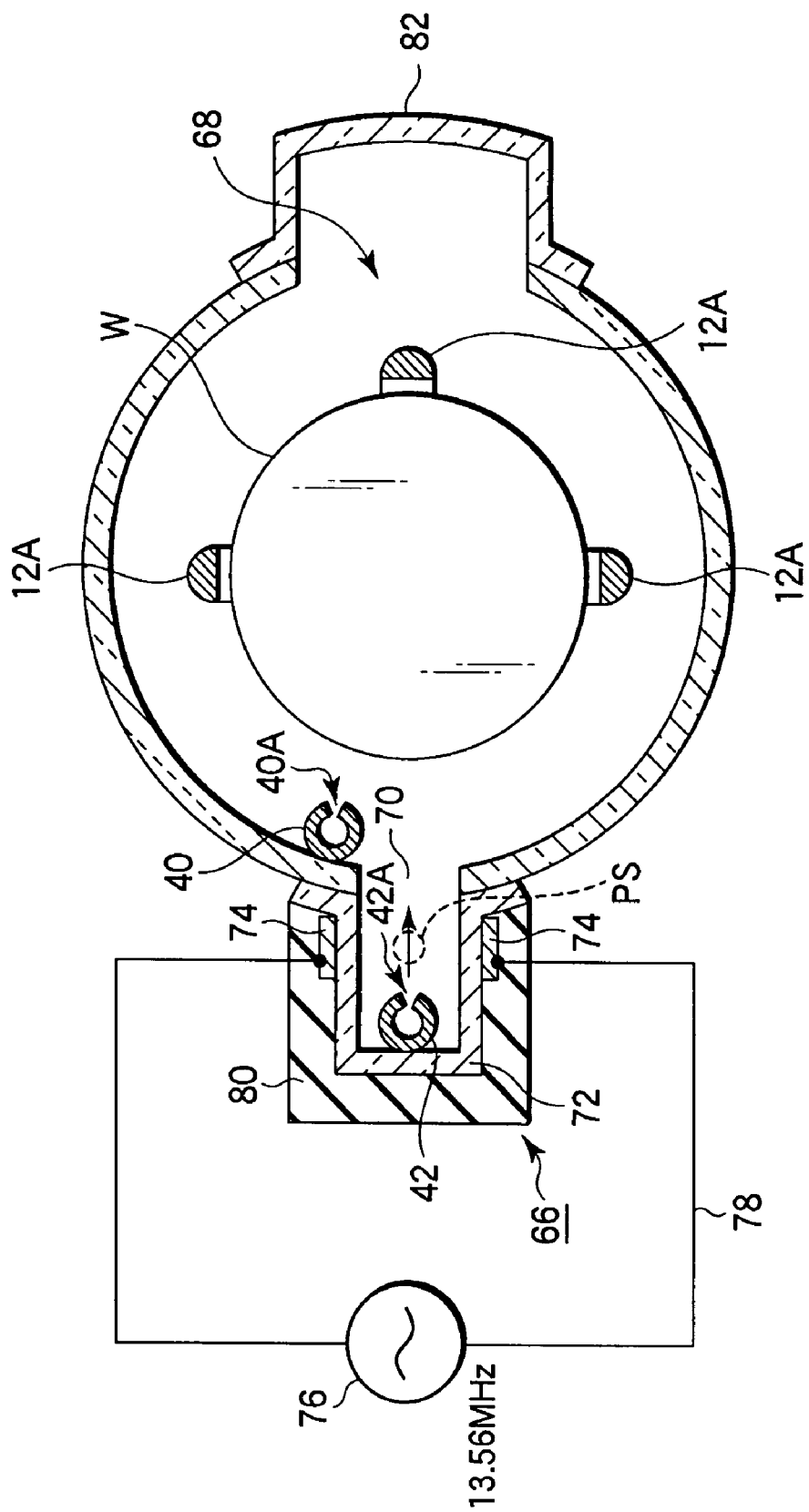
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas comprising dichlorosilane (DCS: $SiH_2Cl_2$) gas as a source gas, which contains a film source element and no amino group, a second process gas comprising oxygen ($O_2$) gas as an oxidizing gas, and a third process gas comprising ammonia ($NH_3$) gas as a preliminary treatment gas. The film formation apparatus 2 is configured to form a silicon oxide film on target substrates by CVD in the process field.

The film formation apparatus 2 includes a process container 4 shaped as a cylindrical column with a ceiling and an opened bottom, in which a process field is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may also be formed as a single unit, i.e., a cylindrical quartz column that includes a manifold 8.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a first process gas supply circuit 30, a second process gas supply circuit 32, a third process gas supply circuit 34, and a inactive gas supply circuit 36. The first process gas supply circuit 30 is arranged to supply a first process gas comprising a source gas, which contains a film source element (Si in this embodiment) and no amino group, such as dichlorosilane (DCS: $SiH_2Cl_2$) gas. The second process gas supply circuit 32 is arranged to supply a second process gas comprising an oxidizing gas, such as oxygen ($O_2$) gas. The third process gas supply circuit 34 is arranged to supply a third process gas comprising a preliminary treatment gas, such as ammonia ($NH_3$) gas. The inactive gas supply circuit 36 is arranged to supply an inactive gas, such as $N_2$ gas, as an inactive gas for dilution, purge, or pressure control. Each of the first to third process gases may be mixed with a suitable amount of carrier gas (dilution gas), as needed. However, such a carrier gas will not be mentioned, hereinafter, for the sake of simplicity of explanation.

More specifically, the first process gas supply circuit 30 and inactive gas supply circuit 36 include a common gas distribution nozzle 40, and the second and third process gas supply circuits 32 and 34 include a common gas distribution nozzle 42. Each of the gas distribution nozzles 40 and 42 is formed of a quartz pipe which penetrates the sidewall of the manifold 8 from the outside and then turns and extends upward (see FIG. 1). The gas distribution nozzles 40 and 42 respectively have a plurality of gas spouting holes 40A and 42A, each set of holes being formed at predetermined intervals in the longitudinal direction (the vertical direction) over all the wafers W on the wafer boat 12. Each of the gas spouting holes 40A and 42A delivers the corresponding process gas almost uniformly in the horizontal direction, so as to form gas flows parallel with the wafers W on the wafer boat 12.

The first process gas supply circuit 30 and inactive gas supply circuit 36 may have respective gas distribution nozzles. Similarly, the second and third process gas supply circuits 32 and 34 may have respective gas distribution nozzles.

The nozzle 40 is connected to gas sources 30S and 36S of DCS gas and $N_2$ gas, respectively, through gas supply lines (gas passages) 50 and 56, respectively. The nozzle 42 is connected to gas sources 32S and 34S of $O_2$ gas and $NH_3$ gas, respectively, through gas supply lines (gas passages) 52 and 54, respectively. The gas supply lines 50, 52, 54, and 56 are provided with switching valves 50A, 52A, 54A, and 56A and flow rate controllers 50B, 52B, 54B, and 56B, such as mass flow controllers, respectively. With this arrangement, DCS gas, $O_2$ gas, $NH_3$ gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertically long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 42 of the second and third process gases is bent outward in the radial direction of the process container 4, at a position lower than the lowermost wafer W on the wafer boat 12. Then, the gas distribution nozzle 42 vertically extends at the deepest position (the farthest position from the center of the process container 4) in the gas exciting section 66. As shown also in FIG. 2, the gas distribution nozzle 42 is separated outward from an area sandwiched between the pair of electrodes 74 (a position where the RF electric field is most intense), i.e., a plasma generation area PS where the main plasma is actually generated. Each of the second process gas comprising $O_2$ gas and the third process gas comprising $NH_3$ gas is spouted from the gas spouting holes 42A of the gas distribution nozzle 42 toward the plasma generation area PS. Then, each of the second and third process gases is excited (decomposed or activated) in the plasma generation area PS, and is supplied in this state containing oxygen radicals ($O^*$, $O_2^*$) or ammonia radicals ($NH_3^*$) onto the wafers W on the wafer boat 12 (the symbol [*] denotes that it is a radical).

An insulating protection cover 80 made of, e.g., quartz is attached to and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas and inactive gas is disposed. The gas distribution nozzle 40 extends vertically upward on one side of the outside of the opening 70 (in the process container 4). Each of the first process gas comprising DCS gas and the inactive gas comprising $N_2$ is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

Figure 3:
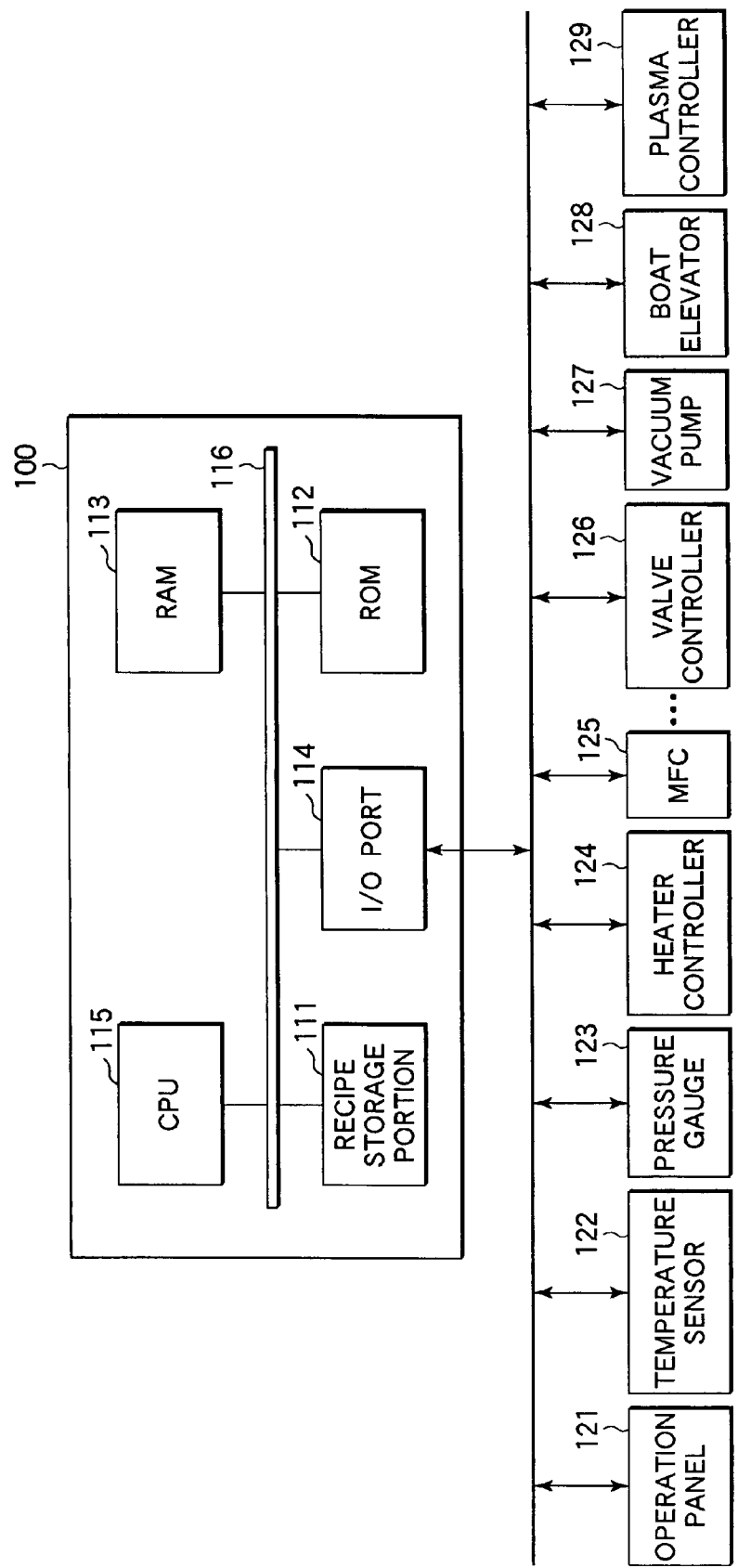
FIG. 3 is a view showing the structure of the main control section of the apparatus shown in FIG. 1.

The film formation apparatus 2 further includes a main control section 100 formed of, e.g., a computer, to control the entire apparatus. FIG. 3 is a view showing the structure of the main control section 100. As shown in FIG. 3, the main control section 100 is connected to an operation panel 121, (a group of) temperature sensors 122, (a group of) pressure gages 123, a heater controller 124, MFCs 125 (corresponding to the flow rate controllers 50B, 52B, 54B, and 56B in FIG. 1), valve controllers 126, a vacuum pump 127 (corresponding to the vacuum-exhaust system GE in FIG. 1), a boat elevator 128 (corresponding to the elevating mechanism 25 in FIG. 1), a plasma controller 129, and so forth.

The operation panel 121 includes a display screen and operation buttons, and is configured to transmit operator's instructions to the main control section 100, and show various data transmitted from the main control section 100 on the display screen. The temperature sensors 122 are configured to measure the temperature at respective portions inside the process container 4 and exhaust line, and transmit measurement values to the main control section 100. The pressure gages 123 are configured to measure the pressure at respective portions inside the process container 4 and exhaust line, and transmit measurement values to the main control section 100.

The heater controller 124 is configured to control the respective sections of the heater 86. The heater controller 124 turns on the respective sections of the heater 86 to generate heat, in accordance with instructions from the main control section 100. The heater controller 124 is also configured to measure the power consumption of the respective sections of the heater 86, and transmit the readings to the main control section 100.

The MFCs 125 are respectively disposed on the piping of the gas supply lines. Each MFC 125 is configured to control the flow rate of a gas flowing through the corresponding line in accordance with instructed values received from the main control section 100. Further, each MFC 125 is configured to measure the flow rate of a gas actually flowing, and transmit the reading to the main control section 100.

The valve controllers 126 are respectively disposed on the piping of the gas supply lines and configured to control the opening rate of valves disposed on the piping, in accordance with instructed values received from the main control section 100. The vacuum pump 127 is connected to the exhaust line and configured to exhaust gas from inside the process container 4.

The boat elevator 128 is configured to move up the lid 18, so as to load the wafer boat 12 (semiconductor wafers W) placed on the rotary table 16 into the process container 4. The boat elevator 128 is also configured to move the lid 18 down, so as to unload the wafer boat 12 (semiconductor wafers W) placed on the rotary table 16 from the process container 4.

The plasma controller 129 is configured to control the gas exciting section 66 in accordance with instructions received from the main control section 100. Consequently, the plasma controller 129 controls generation of radicals of oxygen gas or ammonia gas, when the gas is supplied and activated in the gas exciting section 66.

The main control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 2 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the process container 4, start/stop timing for supply of process gases, and supply rates of process gases, from the time semiconductor wafers W are loaded into the process container 4 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, boat elevator 128, and plasma controller 129 and is configured to control output/input of data or signals.

The CPU (Central Processing Unit) 115 is the hub of the main control section 100. The CPU 115 is configured to run control programs stored in the ROM 112, and control an operation of the film formation apparatus 2, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the process container 4 and exhaust line. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a film formation method (so called ALD (Atomic Layer Deposition) or MLD (Molecular Layer Deposition) film formation) performed under the control of the main control section 100 in the apparatus shown in FIG. 1. In the film formation method according to this embodiment, a silicon oxide film is formed on semiconductor wafers W by CVD. In order to achieve this, a first process gas comprising dichlorosilane (DCS) gas as a source gas containing a film source element and no amino group, a second process gas comprising $O_2$ gas as an oxidizing gas, and a third process gas comprising $NH_3$ gas as a preliminary treatment gas are selectively supplied into the process field 5 accommodating wafers W.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to third process gases are intermittently supplied from the respective gas distribution nozzles 40 and 42 at controlled flow rates.

In summary, at first, the third process gas comprising $NH_3$ gas is supplied from the gas spouting holes 42A of the gas distribution nozzle 42 to form gas flows parallel with the wafers W on the wafer boat 12. The third process gas is selectively excited and partly turned into plasma when it passes through the plasma generation area PS between the pair of electrodes 74. At this time, ammonia radicals (activated species) NH$_3$*, are produced. The radicals flow out from the opening 70 of the gas exciting section 66 toward the center of the process container 4, and are supplied into gaps between the wafers W in a laminar flow state. When ammonia radicals are supplied onto the wafers W, they provide a preliminary treatment on the surface of the wafers W (first stage: preliminary treatment).

Then, the first process gas comprising DCS gas is supplied from the gas spouting holes 40 of the gas distribution nozzle 40 to form gas flows parallel with the wafers W on the wafer boat 12. While being supplied, molecules of DCS gas and molecules and atoms of decomposition products generated by gas decomposition are adsorbed on the pre-treated surface of the wafers W to form an adsorption layer (second stage: DCS adsorption).

Then, the second process gas comprising O$_2$ gas is supplied from the gas spouting holes 42A of the gas distribution nozzle 42 to form gas flows parallel with the wafers W on the wafer boat 12. The second process gas is selectively excited and partly turned into plasma when it passes through the plasma generation area PS between the pair of electrodes 74. At this time, oxygen radicals (activated species), such as O* and O$_2$*, are produced. The radicals flow out from the opening 70 of the gas exciting section 66 toward the center of the process container 4, and are supplied into gaps between the wafers W in a laminar flow state. When oxygen radicals are supplied onto the wafers W, they react with Si in the adsorption layer on the wafers W, and a thin film of silicon oxide is thereby formed on the wafers W (third stage: oxidation).

Figure 4:
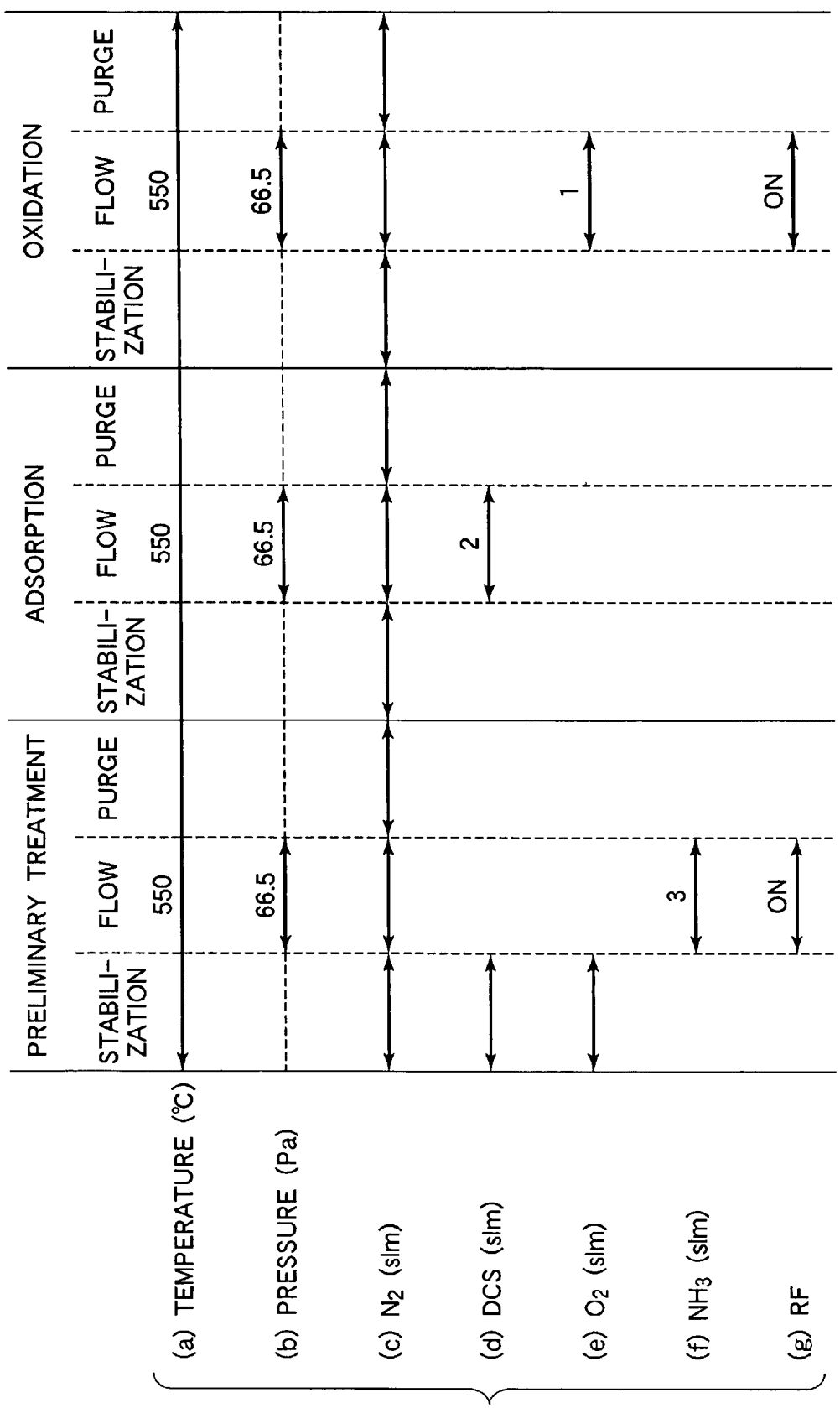
FIG. 4 is a timing chart showing the recipe of a film formation method according to the embodiment of the present invention.

FIG. 4 is a timing chart showing the recipe of a film formation method according to the embodiment of the present invention. As shown in FIG. 4, the film formation method according to this embodiment is arranged to alternately repeat first to third stages ST1 to ST3 in this order. A cycle comprising the first to third stages ST1 to ST3 is repeated a number of times, e.g., 100 times, and thin films of silicon oxide formed by respective cycles are laminated, thereby arriving at a silicon oxide film having a target thickness. The respective stages will be explained in more detail below.

[First Stage ST1: Preliminary Treatment]

At first, nitrogen gas is supplied into the process field 5 at a predetermined flow rate, as shown in FIG. 4, (c). Further, the process field 5 is set at a predetermined temperature, such as 550° C., as shown in FIG. 4, (a). At this time, the process field 5 is exhausted to set the process field 5 at a predetermined pressure, such as 66.5 Pa (0.5 Torr), as shown in FIG. 4, (b). These operations are continued until the process field 5 is stabilized at the predetermined pressure and temperature (stabilization step).

When the process field 5 is stabilized at the predetermined pressure and temperature, an RF power is applied between the electrodes 11 (RF: ON), as shown in FIG. 4, (g). Further, ammonia gas is supplied to a position between the electrodes 11 (in the gas exciting section 66) at a predetermined flow rate, such as 3 slm (standard liter per minute), as shown in FIG. 4, (f). Ammonia gas thus supplied is excited (activated) into plasma between the electrodes 11 and generates ammonia radicals. The radicals thus generated are supplied from the gas exciting section 66 into the process field 5. Further, nitrogen gas is also supplied into the process field 5 at a predetermined flow rate, as shown in FIG. 4, (c) (flow step).

The temperature of the process field 5 is preferably set to be from room temperature (RT) to 800° C. If the temperature is lower than room temperature, no oxide film may be formed. If the temperature is higher than 880° C., uniformity may be deteriorated in the quality and thickness of a silicon oxide film to be formed. The temperature of the process field 5 is more preferably set to be 100 to 80° C. and furthermore preferably to be 400 to 600° C. This temperature range makes it possible to further improve uniformity in the quality and thickness of a silicon oxide film to be formed.

The flow rate of ammonia gas is preferably set to be 10 sccm to 50 slm. This flow rate range makes it possible to generate plasma without difficulty and to supply radicals sufficient to perform the preliminary treatment on the surface of the semiconductor wafers W.

The RF power is preferably set to be 10 to 1,500 W. If the power is lower than 10 W, it is difficult to generate ammonia radicals. If the power is higher than 1,500 W, the quartz wall of the gas exciting section 66 may be damaged. The RF power is more preferably set to be 50 to 500 W. This power range makes it possible to efficiently generate radicals.

The pressure of the process field 5 is preferably set to be 0.133 Pa (1 mTorr) to 13.3 kPa (100 Torr). This pressure range makes it possible to easily generate ammonia radicals and to increase the mean free path of radicals in the process field 5. The pressure of the process field 5 is more preferably set to be 40 to 100 Pa. This pressure range makes it possible to easily control the pressure of the process field 5.

The pressure inside the gas exciting section 66 (the pressure at the gas spouting holes) is preferably set to be 0.133 Pa to 13.3 kPa, and more preferably to be 70 to 600 Pa. This pressure range makes it possible to generate plasma without difficulty and to supply radicals sufficient to perform the preliminary treatment on the surface of the semiconductor wafers W.

After ammonia gas is supplied for a predetermined time period, the supply of ammonia gas is stopped and the application of RF power is stopped. On the other hand, nitrogen gas is kept supplied into the process field 5 at a predetermined flow rate, as shown in FIG. 4, (c). Further, the process field 5 is exhausted to exhaust gas therein out of the process field 5 (purge step).

It should be noted that, in light of the film formation sequence, the temperature of the process field 5 is preferably set to be constant over the first to third stages. Accordingly, in this embodiment, the temperature of the process field 5 is set at 550° C. over the first to third stages. Further, the process field 5 is kept exhausted over the first to third stages.

[Second Stage ST2: DCS Adsorption]

Subsequently, while nitrogen gas is supplied into the process field 5 at a predetermined flow rate, as shown in FIG. 4, (c), the process field 5 is set at a predetermined temperature, such as 550° C., as shown in FIG. 4, (a). At this time, the process field 5 is exhausted to set the process field 5 at a predetermined pressure, such as 66.5 Pa, as shown in FIG. 4, (b). These operations are continued until the process field 5 is stabilized at the predetermined pressure and temperature (stabilization step).

When the process field 5 is stabilized at the predetermined pressure and temperature, DCS gas is supplied into the process field 5 at a predetermined flow rate, such as 2 slm, as shown in FIG. 4, (d), and nitrogen gas is also supplied into the process field 5 at a predetermined flow rate, as shown in FIG. 4, (c) (flow step). DCS gas thus supplied into process field is heated and thereby activated in the process field 5, and forms an adsorption layer on the surface of the wafers W.

In the first stage ST1, when the preliminary treatment is performed on the surface of the wafers W by ammonia radicals, —OH groups and —H groups present on the surface of the wafers W are partly replaced with —NH$_2$ groups. Accordingly, when the second stage ST2 is started, —NH$_2$ groups are present on the surface of the wafers W. When DCS is supplied in this state, the DCS is thermally activated and reacts with —NH₂ groups on the surface of the wafers W, thereby accelerating adsorption of Si on the surface of the wafers W.

The flow rate of DCS gas is preferably set to be 10 sccm to 10 slm. If the flow rate is lower than 10 sccm, DCS supply onto the wafers W may be insufficient. If the flow rate is higher than 10 slm, the ratio of DCS contributory to adsorption onto the wafers W may become too low. The flow rate of DCS gas is more preferably set to be 0.5 to 3 slm. This flow rate range makes it possible to promote DCS adsorption onto the wafers W.

The pressure of the process field 5 is preferably set to be 0.133 Pa to 13.3 kPa. This pressure range makes it possible to promote DCS adsorption onto the wafers W. The pressure of the process field 5 is more preferably set to be 40 to 100 Pa. This pressure range makes it possible to easily control the pressure of the process field 5.

After DCS gas is supplied for a predetermined time period, the supply of DCS gas is stopped. On the other hand, nitrogen gas is kept supplied into the process field 5 at a predetermined flow rate, as shown in FIG. 4, (c). Further, the process field 5 is exhausted to exhaust gas therein out of the process field 5 (purge step).

[Third Stage ST3: Oxidation]

Subsequently, while nitrogen gas is supplied into the process field 5 at a predetermined flow rate, as shown in FIG. 4, (c), the process field 5 is set at a predetermined temperature, such as 550° C., as shown in FIG. 4, (a). At this time, the process field 5 is exhausted to set the process field 5 at a predetermined pressure, such as 66.5 Pa, as shown in FIG. 4, (b). These operations are continued until the process field 5 is stabilized at the predetermined pressure and temperature (stabilization step).

When the process field 5 is stabilized at the predetermined pressure and temperature, an RF power is applied between the electrodes 11 (RF: ON), as shown in FIG. 4, (g). Further, oxygen gas is supplied to a position between the electrodes 11 (in the gas exciting section 66) at a predetermined flow rate, such as 1 slm, as shown in FIG. 4, (e). Oxygen gas thus supplied is excited (activated) into plasma between the electrodes 11 and generates oxygen radicals (O* and O₂*). The oxygen radicals thus generated are supplied from the gas exciting section 66 into the process field 5. Further, nitrogen gas is also supplied into the process field 5 at a predetermined flow rate, as shown in FIG. 4, (c) (flow step).

The flow rate of oxygen gas is preferably set to be 10 sccm to 50 slm. This flow rate range makes it possible to generate plasma without difficulty and to supply oxygen radicals sufficient to oxidize Si in the adsorption layer on the wafers W. The flow rate of oxygen gas is more preferably set to be 0.5 to 5 slm. This flow rate range makes it possible to stably generate oxygen plasma.

The RF power is preferably set to be 10 to 1,500 W. If the power is lower than 10 W, it is difficult to generate oxygen radicals. If the power is higher than 1,500 W, the quartz wall of the gas exciting section 66 may be damaged. The RF power is more preferably set to be 50 to 500 W. This power range makes it possible to efficiently generate oxygen radicals.

The pressure of the process field 5 is preferably set to be 0.133 Pa to 13.3 kPa. This pressure range makes it possible to easily generate oxygen radicals and to increase the mean free path of oxygen radicals in the process field 5. The pressure of the process field 5 is more preferably set to be 40 to 400 Pa. This pressure range makes it possible to easily control the pressure of the process field 5.

The pressure inside the gas exciting section 66 (the pressure at the gas spouting holes) is preferably set to be 0.133 Pa to 13.3 kPa, and more preferably to be 70 to 400 Pa. This pressure range makes it possible to generate plasma without difficulty and to supply oxygen radicals sufficient to oxidize Si in the adsorption layer on the wafers W.

After oxygen gas is supplied for a predetermined time period, the supply of oxygen gas is stopped and the application of RF power is stopped. On the other hand, nitrogen gas is kept supplied into the process field 5 at a predetermined flow rate, as shown in FIG. 4, (c). Further, the process field 5 is exhausted to exhaust gas therein out of the process field 5 (purge step).

[Finish of Film Formation]

As described above, the film formation method according to this embodiment is arranged to alternately repeat a cycle comprising first to third stages ST1 to ST3 in this orders, e.g., 100 times. In each cycle, ammonia radicals are supplied onto the wafers W to perform the preliminary treatment on the surface, then DCS is supplied onto the wafers W to form a DCS adsorption layer, and then oxygen radicals are supplied to oxidize the adsorption layer to form a silicon oxide film. As a result, a silicon oxide film of high quality can be formed with high efficiency.

When the silicon oxide film formed on the surface of the semiconductor wafers W reaches a predetermined thickness, the wafers W are unloaded. Specifically, nitrogen is supplied into the process field 5 at a predetermined flow rate, so that the pressure inside the process field 5 is returned to atmospheric pressure, and the process field 5 is set at a predetermined temperature. Then, the lid 18 is moved down by the boat elevator 25, and the wafer boat 12 is thereby unloaded out of the process container 4, along with the wafers W.

[Experiment]

A silicon oxide film was formed by a film formation method according to the embodiment described above in the apparatus shown in FIG. 1, and was examined in terms of the components thereof. In this experiment, the thickness of a silicon oxide film formed on silicon wafers W was set at 2 nm (30 cycles) in a present example PE1, and at 3 nm (95 cycles) in a present example PE2. The process conditions described above in the embodiment were employed as the reference for the film formation process. The concentration of components (Si, O, and N) in the silicon oxide film thus formed was measured at the central portion (CT) and end portion (ED) of the wafers W. For this measurement, an XPS (X-ray Photoelectron Spectrometer) was used.

Figure 5:
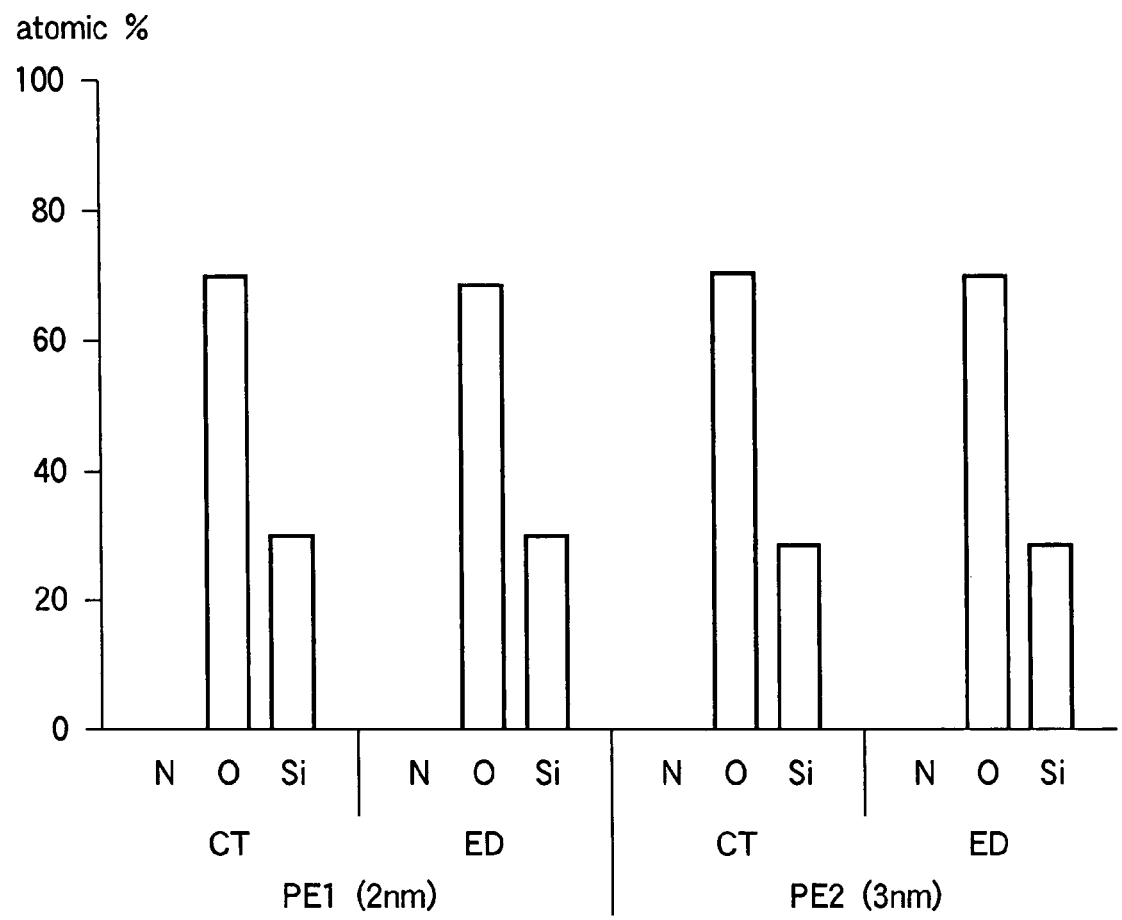
FIG. 5 is a graph showing the concentration of components in silicon oxide films obtained by an experiment.

FIG. 5 is a graph showing the concentration of components in the silicon oxide films obtained by the experiment. As shown in FIG. 5, it was confirmed that the thin films formed by the film formation method according to the embodiment were silicon oxide films (SiO₂). The films contained essentially no nitrogen with a concentration of not more than 0.7%.

Further, the planar uniformity of the silicon oxide films of the present examples PE1 and PE2 was measured. As a result, the present example PE1 (2 nm: 30 cycles) rendered a film thickness fluctuation band of 0.067 nm. The present example PE2 (3 nm: 95 cycles) rendered a film thickness fluctuation band of 0.085 nm. Hence, it was confirmed that the silicon oxide films formed by the method according to the embodiment had good planar uniformity.

[Consequence and Modification]

The embodiment described above is arranged to repeat a plurality of times a cycle comprising the preliminary treatment stage, adsorption stage, and oxidation stage, so as to form a silicon oxide film on semiconductor wafers W. The silicon oxide film thus formed contains essentially no nitrogen and has good planar uniformity. Accordingly, a silicon oxide film of high quality can be formed at a low temperature.

The embodiment described above is exemplified by a process for forming a silicon oxide film. In this respect, the present invention may be applied to a process for forming an oxide film of another element, such as germanium (Ge), antimony (Sb), tellurium (Te), hafnium (Hf), aluminum (Al), zirconium (Zr), strontium (Sr), titanium (Ti), yttrium (Y), lanthanum (La), radon (Rn), tantalum (Ta), barium (Ba), tungsten (W), copper (Cu), silver (Ag), or gold (Au). In this case, an oxide film of high quality can be formed at a low temperature by use of a source gas (compound gas) containing a corresponding element as a film source element and no amino group. Particularly, where a method according to the present invention is applied to a process for forming an oxide film of zirconium, hafnium, or yttrium ($ZrO_2$, $HfO_2$, or $Y_2O_3$), the effect of forming an oxide film of high quality at a low temperature is prominent.

In the embodiment described above, plasma is used to generate oxygen radicals and ammonia radicals. In this respect, another exciting medium, such as catalyst, UV, heat, or magnetic force, may be used for activating the oxidizing gas and preliminary treatment gas.

In the embodiment described above, the first process gas contains DCS gas as a source gas containing Si and no amino group. In this respect, the source gas containing Si and no amino group may be one or more gases selected from the group consisting of DCS, monosilane ($SiH_4$), tetrachlorosilane (TCS: $SiCl_4$), disilane ($Si_2H_6$), hexachlorodisilane ($Si_2Cl_6$), and TEOS ($Si(OC_2H_5)_4$).

In the embodiment described above, the second process gas contains oxygen gas as an oxidizing gas. In this respect, the oxidizing gas may be one or more gases selected from the group consisting of oxygen, ozone ($O_3$), nitrogen oxide (NO), nitrogen dioxide ($NO_2$), dinitrogen oxide ($N_2O$), and water vapor ($H_2O$).

In the embodiment described above, the third process gas contains ammonia gas as a preliminary treatment gas. In this respect, the preliminary treatment gas for accelerating adsorption of Si in the adsorption stage may be one or more gases selected from the group consisting of ammonia, nitrogen ($N_2$), nitrogen oxide (NO), dinitrogen oxide ($N_2O$), and nitrogen dioxide ($NO_2$).

In the embodiment described above, a silicon oxide film is formed on semiconductor wafers W by performing 100 cycles. In this respect, the number of cycles may be decreased to, e.g., 50 cycles, or may be increased to, e.g., 200 cycles. Also in this case, a silicon oxide film can be formed to have a predetermined thickness by adjusting, e.g., the flow rates of DCS gas, oxygen gas, and ammonia gas, and the RF power, in accordance with the number of cycles.

In the embodiment described above, nitrogen gas is supplied as a dilution gas when each of the process gases, such as DCS gas, is supplied. In this respect, no nitrogen gas may be supplied when each of the process gases is supplied. However, each of the process gases preferably contains nitrogen gas as a dilution gas, because the process time can be more easily controlled if it is so arranged. The dilution gas consists preferably of an inactive gas, such as nitrogen gas, or helium gas (He), neon gas (Ne), argon gas (Ar), or xenon gas (Xe) in place of nitrogen gas.

In the embodiment described above, DCS gas and nitrogen gas are supplied through a common gas supply nozzle, and oxygen gas and ammonia gas are supplied through a common gas supply nozzle. Alternatively, gas supply nozzles may be respectively disposed in accordance with the types of gases. Further, a plurality of gas supply nozzles may be connected to the sidewall of the process container 4 near the bottom, to supply each gas through a plurality of nozzles. In this case, a process gas is supplied through a plurality of gas supply nozzles into the process container 4, and thereby more uniformly spreads in the process container 4.

In the embodiment described above, the film formation apparatus employed is a heat processing apparatus of the batch type having a single-tube structure. However, for example, the present invention may be applied to a vertical heat processing apparatus of the batch type having a process container 4 of the double-tube type, which is formed of inner and outer tubes. Alternatively, the present invention may be applied to a heat processing apparatus of the single-substrate type. The target substrate is not limited to a semiconductor wafer W, and it may be a glass substrate for, e.g., an LCD.

The control section 100 of the film formation apparatus is not limited to a specific system, and it may be realized by an ordinary computer system. For example, a program for executing the process described above may be installed into a multi-purpose computer, using a storage medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined storage medium, as described above. In this case, for example, a program may be pasted on a bulletin board (BBS) on a communication network, and then supplied through a network while being superimposed on a carrier wave. The program thus provided would then be activated and ran under the control of the OS of the computer, as in other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for forming a silicon oxide film containing a low concentration of nitrogen on a target substrate by CVD, in a process container configured to be selectively supplied with a silicon source gas, an oxygen gas, and ammonia gas and equipped with an exciting mechanism configured to generate plasma by exciting the oxygen gas and the ammonia gas, the method performing a plurality of cycles to laminate thin films, each of the cycles alternately comprising, in the order:

a first supply step of supplying the ammonia gas to the process container without supplying either of the silicon source gas and the oxygen gas to the process container, the first supply step including an excitation period of supplying the ammonia gas to the process container while generating plasma of the ammonia gas by excitation in the exciting mechanism;

a first intermediate step of supplying an inactive gas to the process container and exhausting gas from the process container without supplying any of the silicon source gas, the oxygen gas, and the ammonia gas to the process container;

a second supply step of supplying the silicon source gas to the process container without supplying either of the oxygen gas and the ammonia gas to the process container, thereby forming an adsorption layer containing Si on the target substrate; and a third supply step of supplying the oxygen gas to the process container without supplying either of the silicon source gas and the ammonia gas to the process container, the third supply step including an excitation period of supplying the oxygen gas to the process container while generating plasma of the oxygen gas by excitation in the exciting mechanism, thereby oxidizing the adsorption layer, wherein the method uses conditions within reference conditions to set the low concentration of nitrogen to be not more than 0.7 atomic %, the reference conditions being such that the silicon source gas is a gas containing no amino group, which is selected from the group consisting of dichlorosilane, monosilane, tetrachlorosilane, disilane, hexachlorodisilane, and tetraethoxysilane, the first supply step is performed at beginning of the plurality of cycles to treat an initial underlying layer of the target substrate with ammonia radicals to assist formation of the adsorption layer in the second supply step performed next, and the process container is set at a temperature of 400 to 600° C. therein during each of the cycles, and is set at a pressure of 40 to 100 Pa and at a pressure of 40 to 400 Pa therein during the first and third supply steps, respectively.

2. The method according to claim 1, wherein the process container is set at a pressure therein during the second supply step, which is substantially the same as that of the first supply step.

3. The method according to claim 1, wherein each of the cycles further comprises an intermediate step of exhausting gas from the process container without supplying any of the silicon source gas, the oxygen gas, and the ammonia gas to the process container between the third supply step of this cycle and the first supply step of a next cycle.

4. The method according to claim 3, wherein each of the cycles further comprises an intermediate step of exhausting gas from the process container without supplying any of the silicon source gas, the oxygen gas, and the ammonia gas to the process container, between the second and third supply steps.

5. The method according to claim 4, wherein each of the cycles continuously exhausts gas from the process container through its entire period.

6. The method according to claim 1, wherein the oxygen gas and the ammonia gas are supplied from a common supply port.

7. The method according to claim 6, wherein the exciting mechanism is integrally attached to a sidewall of the process container and forms a plasma generation area, and each of the oxygen gas and the ammonia gas is excited while passing through the plasma generation area.

8. The method according to claim 1, wherein the process container is configured to accommodate a plurality of target substrates at intervals in a vertical direction, and the target substrates are heated by a heater disposed around the process container.

9. The method according to claim 8, wherein each of the silicon source gas, the oxygen gas, and the ammonia gas is supplied from a plurality of gas spouting holes to form gas flows parallel with the target substrates, and the gas spouting holes are arrayed over the target substrates in a vertical direction.

10. The method according to claim 1, wherein the process container is set at a substantially constant temperature therein during each of the cycles.

11. The method according to claim 1, wherein the process container is set at a temperature of 550 to 600° C. therein during each of the cycles.

12. A film formation method for forming a silicon oxide film containing a low concentration of nitrogen on a plurality of target substrates placed at intervals in a vertical direction by CVD, in a process container configured to be selectively supplied with a silicon source gas, an oxygen gas, and ammonia gas and equipped with an exciting mechanism configured to generate plasma by exciting the oxygen gas and the ammonia gas, the method performing a plurality of cycles to laminate thin films, each of the cycles alternately comprising, in the order:

a first supply step of supplying the ammonia gas to the process container without supplying either of the silicon source gas and the oxygen gas to the process container, the first supply step including an excitation period of supplying the ammonia gas to the process container while generating plasma of the ammonia gas by excitation in the exciting mechanism;

a first intermediate step of supplying an inactive gas to the process container and exhausting gas from the process container without supplying any of the silicon source gas, the oxygen gas, and the ammonia gas to the process container;

a second supply step of supplying the silicon source gas to the process container without supplying either of the oxygen gas and the ammonia gas to the process container, thereby forming an adsorption layer containing Si on the target substrates;

a second intermediate step of exhausting gas from the process container without supplying any of the silicon source gas, the oxygen gas, and the ammonia gas to the process container;

a third supply step of supplying the oxygen gas to the process container without supplying either of the silicon source gas and the ammonia gas to the process container, the third supply step including an excitation period of supplying the oxygen gas to the process container while generating plasma of the oxygen gas by excitation in the exciting mechanism, thereby oxidizing the adsorption layer; and a third intermediate step of exhausting gas from the process container without supplying any of the silicon source gas, the oxygen gas, and the ammonia gas to the process container, wherein the method uses conditions within reference conditions to set the low concentration of nitrogen to be not more than 0.7 atomic %, the reference conditions being such that the silicon source gas is a chlorosilane family gas containing no amino group, the first supply step is performed at beginning of the plurality of cycles to treat an initial underlying layer of the target substrates with ammonia radicals to assist formation of the adsorption layer in the second supply step performed next, and the process container is set at a temperature of 400 to 600° C. therein during each of the cycles, and is set at a pressure of 40 to 100 Pa and at a pressure of 40 to 400 Pa therein during the first and third supply steps, respectively.

13. The method according to claim 12, wherein the silicon source gas is selected from the group consisting of dichlorosilane, tetrachlorosilane, and hexachlorodisilane.

14. The method according to claim 12, wherein the silicon source gas is dichlorosilane.

15. The method according to claim 12, wherein the exciting mechanism is integrally attached to a sidewall of the process container and forms a plasma generation area, and each of the oxygen gas and the ammonia gas is excited while passing through the plasma generation area.

16. The method according to claim 12, wherein the target substrates are heated by a heater disposed around the process container.

17. The method according to claim 12, wherein each of the silicon source gas, the oxygen gas, and the ammonia gas is supplied from a plurality of gas spouting holes arrayed in a vertical direction.

18. The method according to claim 12, wherein the process container is set at a substantially constant temperature therein during each of the cycles.

19. The method according to claim 15, wherein the process container is set at a pressure therein during the second supply step, which is substantially the same as that of the first supply step.

20. The method according to claim 15, wherein the process container is set at a temperature of 550 to 600° C. therein during each of the cycles.

* * * * *